(12) United States Patent
Baggen et al.

(10) Patent No.: US 7,733,463 B2
(45) Date of Patent: Jun. 8, 2010

(54) LITHOGRAPHIC APPARATUS AND DEVICE MANUFACTURING METHOD

(75) Inventors: Marcel Koenraad Marie Baggen, Nuenen (NL); Dirk-Jan Bijvoet, Eindhoven (NL); Arjan Martin Van Der Wel, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 535 days.

(21) Appl. No.: 11/418,452

(22) Filed: May 5, 2006

(65) Prior Publication Data

US 2007/0258081 A1 Nov. 8, 2007

(51) Int. Cl.
- *G03B 27/62* (2006.01)
- *G03B 27/64* (2006.01)
- *G03F 1/00* (2006.01)

(52) U.S. Cl. ............................................. 355/76; 430/5
(58) Field of Classification Search ................... 355/75, 355/76; 269/20, 21
See application file for complete search history.

(56) References Cited

U.S. PATENT DOCUMENTS

| | | | | |
|---|---|---|---|---|
| 6,172,738 B1 * | 1/2001 | Korenaga et al. | ............. | 355/53 |
| 6,841,312 B1 * | 1/2005 | Kalk | .............................. | 430/5 |
| 2003/0197841 A1 * | 10/2003 | Araki et al. | ................... | 355/50 |

* cited by examiner

*Primary Examiner*—Georgia Y Epps
*Assistant Examiner*—Ryan Howard
(74) *Attorney, Agent, or Firm*—Pillsbury Winthrop Shaw Pittman, LLP

(57) ABSTRACT

A support constructed to support a patterning object, the patterning object being capable of imparting the radiation beam with a pattern in its cross-section to form a patterned radiation beam, is disclosed, wherein the support comprises a plurality of structures having a plurality of local contact areas, respectively, on which the patterning object is disposed, in use, and a clamp configured to clamp the patterning object to the plurality of contact areas, wherein each structure is configured so that a local shear stiffness of each local contact area is substantially balanced with a local friction limit at each local contact area, respectively.

18 Claims, 5 Drawing Sheets

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning object, which is alternatively referred to as a mask reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning object to the substrate by imprinting the pattern onto the substrate.

A conventional lithographic apparatus, typically comprises a support structure (e.g., a mask table) that is provided and constructed to support the patterning object. Conventionally, the patterning object (e.g., a mask) is clamped by vacuum to the support structure.

In a conventional mask clamp configuration, for example, the mask is preloaded by vacuum to contact areas of a vacuum clamp of the mask table. The contact areas comprise an outer edge, an inner edge and a collection of burls. Each contact area defines a local contact area. At each local contact area, a part of the inertial force to the mask is countered by friction. The amount of friction to be countered for each local contact area is limited. The frictional limit depends on various parameters, such as normal force, contamination level, humidity, material combination, surface roughness, etc. Using a spring-mass model in the scan direction of the vacuum clamp, each local contact area may experience a different stiffness to the mask table. Further, the pre-load, or normal force, may also be different for each local contact area. As a result, at certain mask table acceleration levels, an overlay error may be introduced. Because of increased inertia-forces to the mask, the mask may show a non-reproducible (i.e. incorrectible) micro-slip behavior (hysteresis) resulting in an overlay error. The hysteresis is caused by local slip of the mask at the contact areas. For example, at a certain acceleration level of the mask table, the mask slips at the outer edge while it sticks to the burls and the inner edge. This results in a displacement of the mask when the acceleration phase of the mask table is over and illumination starts.

SUMMARY

It is desirable to reduce an overlay error.

According to an aspect of the invention, there is provided a lithographic apparatus comprising: a support constructed to support a patterning object, the patterning object being capable of imparting the radiation beam with a pattern in its cross-section to form a patterned radiation beam; wherein the support comprises a plurality of structures having a plurality of local contact areas, respectively, on which the patterning object is disposed, in use, and a clamp for clamping the patterning object to the plurality of contact areas, wherein each structure is configured so that the local shear stiffness of each local contact area is substantially balanced with the local friction limit at the each local contact area, respectively.

According to an aspect of the invention, there is provided a lithographic projection apparatus arranged to project a pattern from a patterning object onto a substrate, comprising a support constructed to support the patterning object, the patterning object being capable of imparting the radiation beam with a pattern in its cross-section to form a patterned radiation beam; wherein the support comprises a plurality of structures having a plurality of local contact areas, respectively, on which the patterning object is disposed, in use, and a clamp configured to clamp the patterning object to the plurality of local contact areas, wherein each structure is configured so that the local shear stiffness of each local contact area is substantially balanced with the local friction limit at each local contact area, respectively.

According to an aspect of the invention, there is provided A device manufacturing method, comprising supporting a patterning object on a support, the patterning object being capable of imparting the radiation beam with a pattern in its cross-section to form a patterned radiation beam; clamping a patterning object on a plurality of structures of a support, the plurality of structures having a plurality of local contact areas, respectively, each structure configured so that the local shear stiffness of each local contact area is substantially balanced with the local friction limit at the each local contact area, respectively; and projecting the patterned radiation beam onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
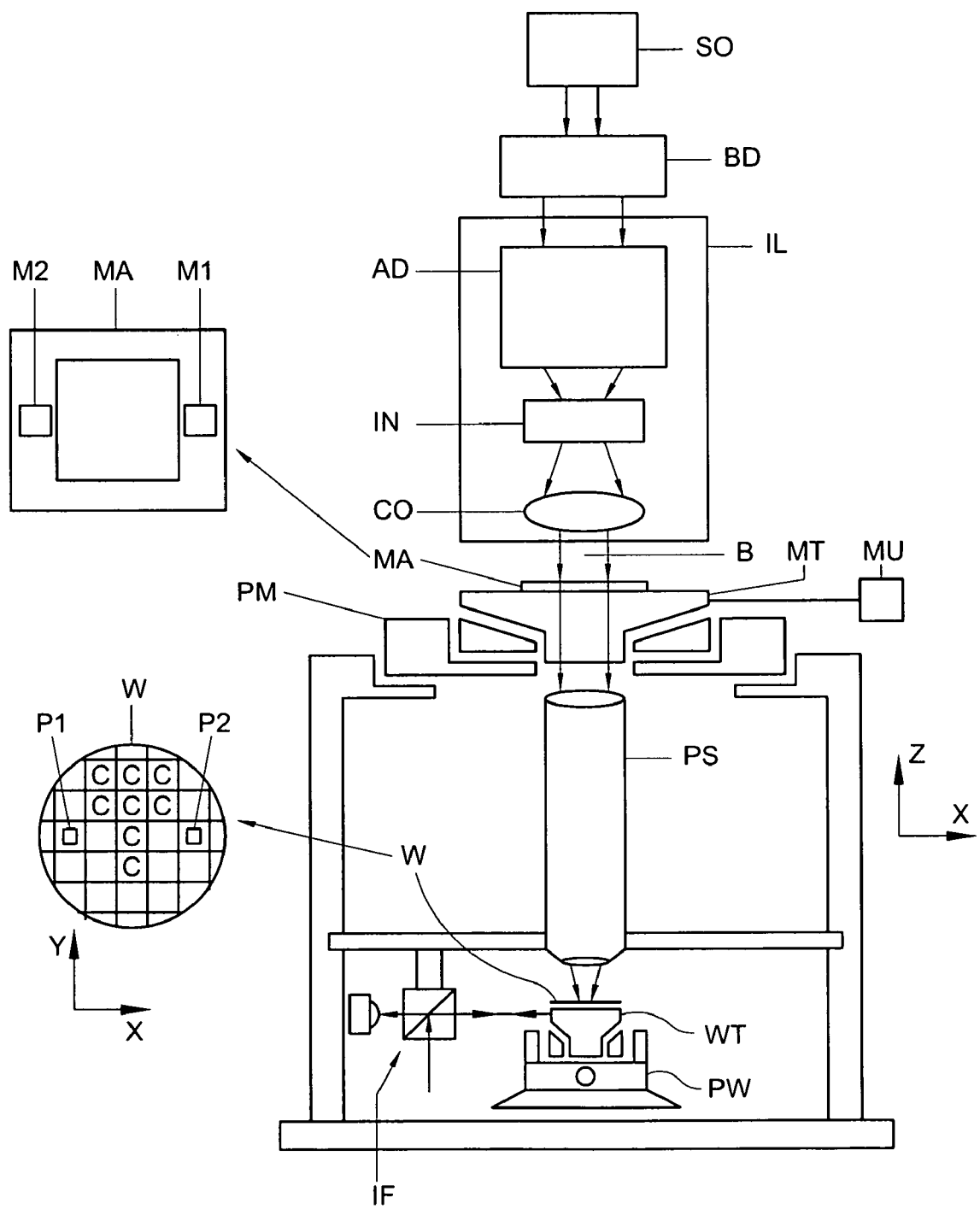
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to support a patterning object (e.g. a mask) MA and connected to a first positioner PM configured to accurately position the patterning object in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning object MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning object in a manner that depends on the orientation of the patterning object, the design of the lithographic apparatus, and other conditions, such as for example whether or not the patterning object is held in a vacuum environment. The support structure can use mechanical, vacuum, electrostatic or other clamping techniques to hold the patterning object. The support structure may be a frame or a table, for example, which may be fixed or movable as required. The support structure may ensure that the patterning object is at a desired position, for example with respect to the projection system. Any use of the terms "reticle" or "mask" herein may be considered synonymous with the more general term "patterning object."

The term "patterning object" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning object may be transmissive or reflective. Examples of patterning objects include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning object (e.g., mask) MA, which is held on the support structure (e.g., mask table) MT, and is patterned by the patterning object. Having traversed the patterning object MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning object MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning object MA and substrate W may be aligned using patterning object alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning object MA, the patterning object alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning object, and the substrate table WT is moved or scanned while a pattern imparted to the radiation beam is projected onto a target portion C. In this mode, generally a pulsed radiation source is employed and the programmable patterning object is updated as required after each movement of the substrate table WT or in between successive radiation pulses during a scan. This mode of operation can be readily applied to maskless lithography that utilizes programmable patterning object, such as a programmable mirror array of a type as referred to above.

Combinations and/or variations on the above described modes of use or entirely different modes of use may also be employed.

Figure 2:
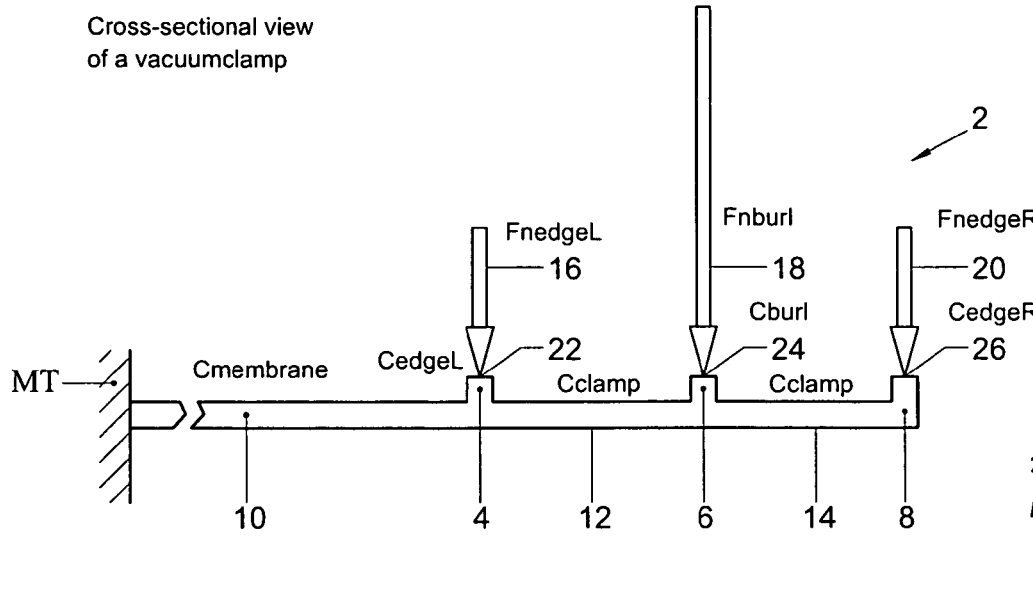
FIG. 2 depicts a cross-sectional view of a conventional clamp.

FIG. 2 depicts a cross-sectional view of a conventional clamp 2. The clamp 2 may be a vacuum clamp configured to clamp the patterning object (not shown) on to the clamp 2 by applying a vacuum to a backside of the patterning object. Other clamping mechanisms may also be used. In FIG. 2, to simplify the illustration the patterning object is not shown. In use however, a patterning object is disposed on the protrusions edgeL, burl and edgeR 4, 6, 8. The clamp 2 is disposed on the support MT. The clamp 2 comprises the plurality of protrusions 4, 6, 8 on which the patterning object is disposed. The plurality of protrusions include two edge protrusions 4, 8. One on the left hand side 4 in the X direction and the second on the right hand side 8 downstream in the X direction. Between the edge protrusions 4, 8 a plurality of burls 6 are disposed (of which one is shown). The protrusions 4, 6, 8 are connected to the support MT by a membrane 10. Each of the protrusions 4, 6, 8 has a local contact area configured to contact and thus, support in use, the patterning object MA. In a conventional vacuum clamp configuration, such as that shown in FIG. 2, the patterning object MA is preloaded by vacuum to the contact areas of the vacuum clamp. The contact areas comprise, as mentioned, an outer edge (edgeR) 8, an inner edge (edgeL) 4 and a plurality of burls arranged, for example, in a row. At each local contact area, a part of the inertia force applied to the patterning object is countered by friction. The amount of friction to be countered for each contact area is limited. The frictional limit depends on various parameters, such as, normal force, contamination level, humidity, material combination, surface roughness, etc. In FIG. 2, as used hereinbelow, Cmembrane refers to the local shear stiffness of the membrane 10, CedgeL refers to the local shear stiffness of the inner edge 4, Cclamp refers to the local shear stiffness of clamp portions 12, 14. The clamp portions 12, 14 being those portions, for example, to which the clamping force is applied, eg. by applying a vacuum. Cburl refers to the local shear stiffness of the burls 6 and Cedge R refers to the local shear stiffness of the outer edge 8. Also shown in FIG. 2 are arrows 16, 18, 20 indicative of a magnitude of the force in the direction normal to the plane in which the clamp is disposed, and hence normal to the plane in which the patterning object MA is disposed. Arrow 16 indicates the magnitude and direction of the force normal Fn to the inner edge 4 and is denoted as FnedgeL. Arrow 18 indicates the magnitude and direction of the force normal Fn to the burls 6 and is denoted as Fnburl and arrow 20 indicates the magnitude and direction of the force normal Fn to the outer edge 8 and is denoted as FnedgeR. In FIG. 2, the local contact areas for the inner edge 4, burls 6 and outer edge 8 are indicated by reference signs 22, 24, 26, respectively. As can be gleaned from FIG. 2, the largest force in a conventional clamp for clamping a mask in the indicated normal direction is the force Fnburl (arrow 18) exerted on the burls 6.

Figure 3:
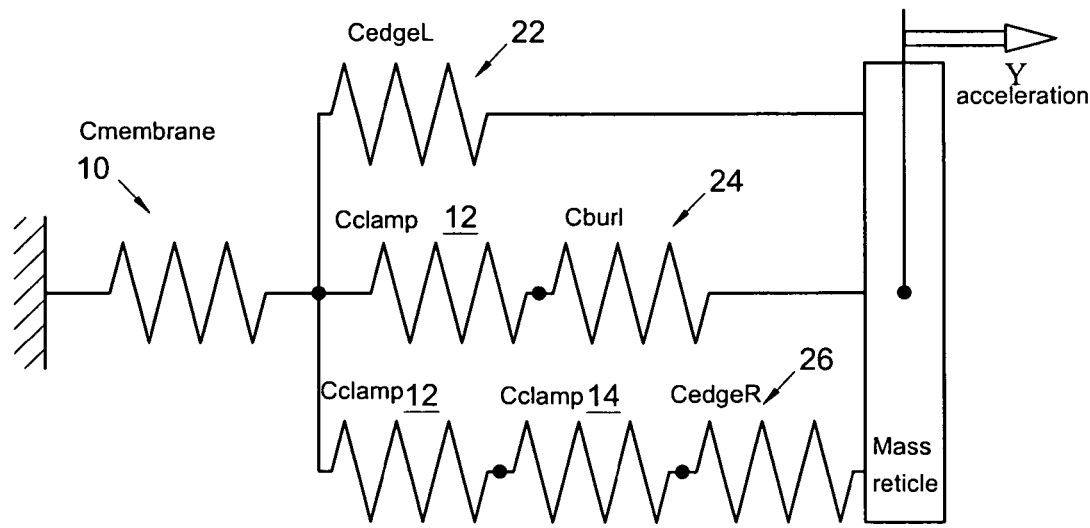
FIG. 3 depicts a spring-mass model in a scan direction (Y) of the conventional clamp shown in FIG. 2.
Figure 4:
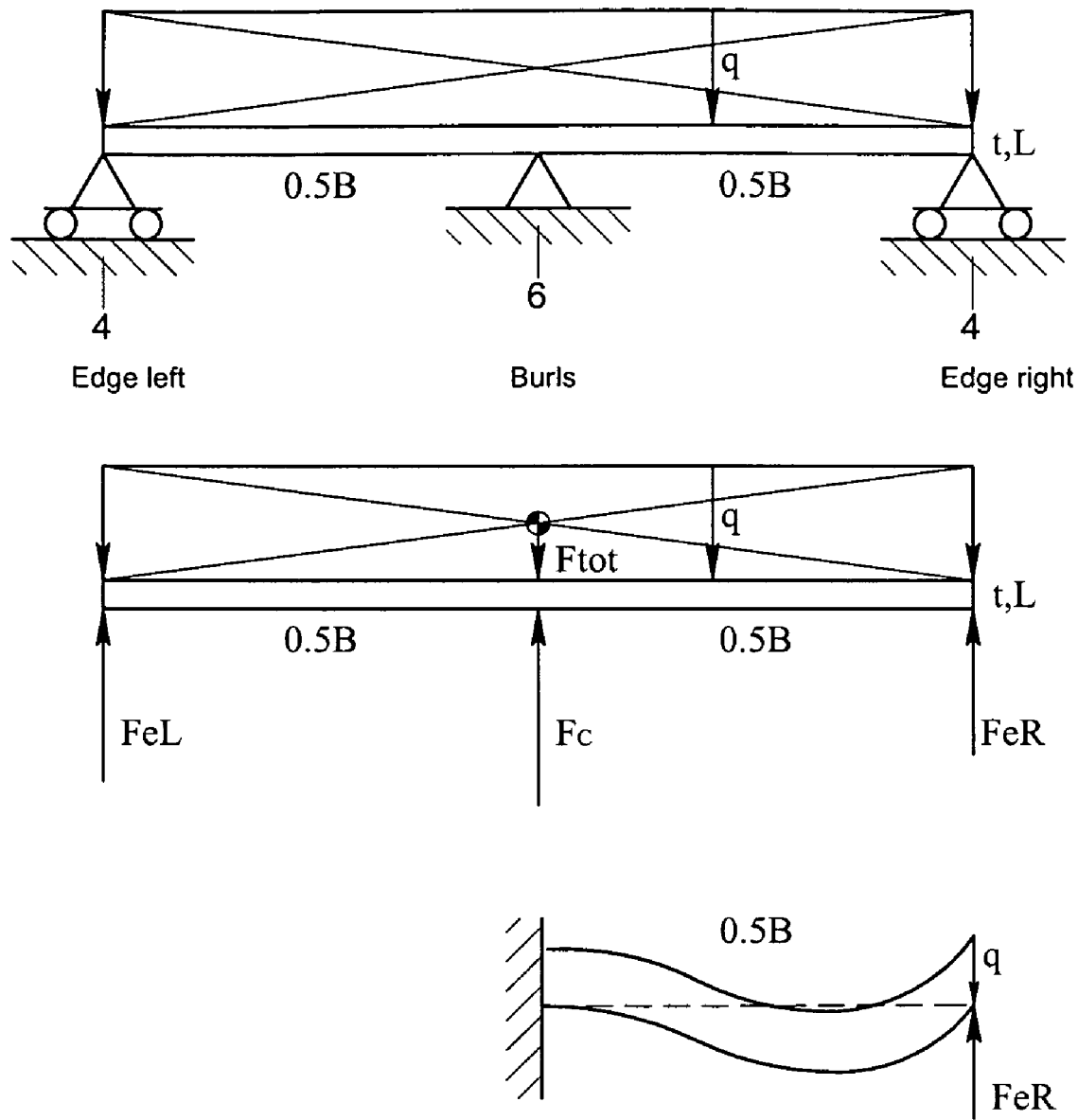
FIG. 4 depicts a relation between the normal forces in the conventional clamp shown in FIG. 2.

FIG. 3 depicts a spring-mass model in a scan direction (Y) of the conventional clamp shown in FIG. 2. As can be seen from the model in FIG. 3, each local contact area 22, 24, 26 experiences a different stiffness with respect to the support MT. The pre-load, or normal force Fn, is also different for each local contact area 22, 24, 26. FIG. 4 depicts the relation between the normal forces in the conventional clamp shown in FIG. 2. In the plot depicted in FIG. 4, the vacuum producing part ('suction cup') of the clamp is represented by a flexible beam, supported by three supports and preloaded by an uniform distributed load q. In the model, the supports Edgeleft and Edgeright (boundary conditions) are only able to generate reaction forces and no torques. It is commented however, that other boundary conditions may result in other normal forces. For the model of an embodiment of the present invention with the mentioned boundary conditions, the normal (contact) forces are calculated.

Table 1 shows the abbreviation for the parameters, the value of the parameters, the units of the parameters and the description of the parameters, respectively.

TABLE 1

| | | | |
|---|---|---|---|
| q = | 12 | [N/m] | Vacuum force |
| Ftot = | | [N] | Total vacuum force, Ftot = q.B |
| Fc = | | [N] | Reaction force of the burls |
| FeL = | | [N] | Reaction force of the left edge |
| FeR = | | [N] | Reaction force of the right edge |
| B = | 0.01 | [m] | Width of the vacuum clamp |
| t = | 0.2e-3 | [m] | Thickness of the vacuum clamp |
| L = | 0.15 | [m] | Length of the vacuum clamp |

The force equation:

$$\Sigma F = 0 => FeL + Fc + FeR - Ftot = 0 => Fc = q.B - 2.FeR \quad 1)$$

From the elasticity theory for beams the bending at the end of the beam can be calculated. For this purpose half of the beam is considered, the middle is clamped and the loads are applied. The displacement at the end of the beam (edge right)

due to the loads is nil. The deformation of half of the beam is the residual (=nil) of the deformations of each individual load which are q and Fer:

$$Y\_tot = Y\_FeR - Y\_q = 0 \quad (2)$$
$$= FeR.(1/2B)^3/(3.E.I) - q.(1/2.B^4/(8.E.I)$$
$$= 0 \Rightarrow FeR = 3/16.q.B$$

The combination of 1) and 2)=>Fc=5/8.q.B

The ratio of Fc/FeR:

$$Fc/FeR = 5/8.q.B(3/16.q.B) \Rightarrow Fc = 10/3.FeR$$

This is the ratio between the normal forces at each contact area. When Coulombs friction is considered (the frictional limit is proportional to the normal force) the frictional limit (F_friction_limit=mu*Fnormal) for each contact area also has the same ratio. To avoid microslip, this is the situation where some contacts slip and others do not, it is desirable that the frictional forces do not exceed the frictional limits or if they do they exceed their limit, all at the same time. This is called macroslip. This can be achieved by balancing each local shear stiffness to its frictional limit in a way that for a certain shear deformation (Yacceleration, which is the same for each contact) the deformation force (=local shear force, Fshear_i=Cshear_i*Yacceleration) reaches their limit at the same time, that is at Yacceleration_max. This is achieved by balancing the local stiffness in the same ratio as the normal forces to each other.

In terms of formulas:

I. The Load:

$$Ffriction\_i/Shear\_Stiffness\_i = Yacceleration = Constant \quad (3)$$
$$\Rightarrow$$

II. The Limit:

When slip occurs:

$$Ffriction\_i = Ffriction\_limit\_i = mu\_i * Fn\_i \quad (4)$$

The combination of 3) and 4) results in:

$$mu\_i * Fn\_i / Shear\_Stiffness\_i = Constant.$$

In words this may be expressed as:

local friction coefficient*local normal force/local shear stiffness=constant

This ratio is valid for this simplified model with these boundary conditions. FEM calculations may result in a deviating ratio. Nevertheless, the Frictional_limit/Local_stiffness may be a constant ratio for whatever normal force ratio.

At certain support structure (e.g., mask table) acceleration levels, an overlay error may be introduced. Because of increased inertia-forces to the patterning object, the patterning object may show a non-reproducible (non-correctable) micro-slip behavior (hysteresis) resulting in an overlay error. The hysteresis is caused by local slip of the patterning object at the contact areas 22, 24, 26. For example, at a certain acceleration level of the support structure (e.g., mask table), the patterning object slips at the outer edge 26 while it sticks to the burls 24 and the inner edge 22. This results in a displacement of the patterning object when the acceleration phase of the patterning object phase is over and illumination starts.

According to an embodiment of the invention, that hysteresis may be addressed by preventing local slip, which implies that when slip occurs it occurs at all contact areas at the same time. This may be achieved, according to an embodiment of the present invention, by optimizing the configuration such that the frictional force at each contact area exceeds the slip limit at the same time. This may be done by balancing (or "tuning") the local stiffness (Cclamp, Cburl, CedgeL and CedgeR) to the slip limit so that the ratio Frictional_limit/Local_stiffness is a constant value. An advantage of an embodiment of the present invention is that by tuning the slip limit to the local stiffness either there is slip at all areas or there is no slip at all.

Figure 5:
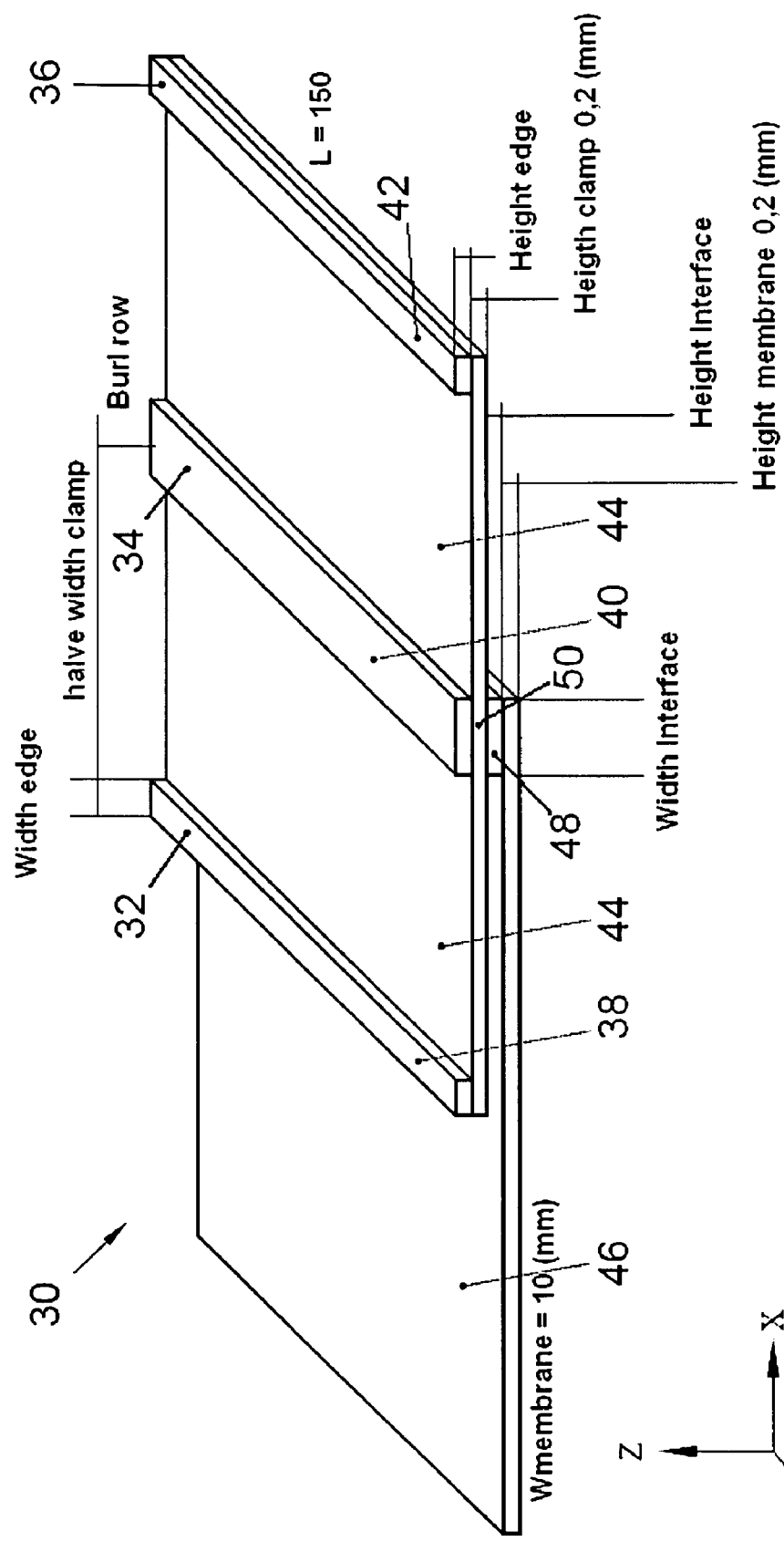
FIG. 5 depicts a clamp according to an embodiment of the present invention.

Referring to FIG. 5, according to an embodiment of the invention, a lithographic apparatus is provided. The apparatus comprises a support 30. The support 30 is constructed to support a patterning object. The support comprises a plurality of structures 32, 34, 36. The structures may be protrusions, such as an inner edge 32, an outer edge 36 and a plurality of burls 34, disposed for example, in a row. Each structure 32, 34, 36 has a plurality of local contact areas 38, 40, 42, respectively, on which the patterning object is disposed, in use. The support 30 further comprises a clamp 44 to clamp the patterning object to the plurality of contact areas 38, 40, 42. Each structure 32, 34, 36 is configured so that the local shear stiffness of each local contact area is substantially balanced with the local friction limit at the each local contact area, respectively. In one embodiment, each structure 32, 34, 36 is configured so that a slip limit of the plurality of structures is exceeded when a predetermined same displacement/deformation force (resulting in a shear force) is applied to each structure 32, 34, 36. A motor unit MU may be provided to apply a force to the support 30 to cause the support to move in a scanning direction (Y) (see FIG. 1). The force applied to the support may be less than the predetermined same force, so that each structure experiences a force lower than the slip limit. In a further embodiment, a local frictional force at each contact area exceeds a slip limit at the same time. In particular, for each structure, a ratio of the local shear stiffness and the local friction limit is a constant value. At the slip limit, the patterning object at a location, including the plurality of local contact areas, on the support may experience a displacement with respect to the location. Further, the local friction limit may be determined by varying the force in a direction normal to the local contact area (Fn), the friction coefficient (mu), or both. The local shear stiffness may be determined by varying a dimension of the structure, the material of the structure, or both. As with a conventional clamp, the clamp may be a vacuum clamp. In the following description of an embodiment of the invention, the nomenclature given above relating to CedgeL, Cmembrane, Cclamp, Cburl, CedgeR and FnedgeL, Fnburl, FnedgeR etc and further parameters, represent the same parameters in an embodiment of the invention, although the values of the parameters will differ with respect to a conventional apparatus, as described hereinbelow.

The friction mechanism may be split up in to two categories: Firstly, Fx=mu·Fn, where the slip limit is linear with the normal contact load and secondly, Fw is not equal to mu·Fn, where the slip limit is not linear with the normal contact load. Depending on the friction mechanism, the configuration, including the shear stiffness, is determined. For example, in the first situation where Fw=mu·Fn, if the slip limit is linear with respect to the normal contact load, Fw=mu·Fn. The normal load due to the vacuum at the burls is 10/3, or any other factor, factor x, times the load at the edges. As a result the shear stiffness of the burls are 10/3(a factor x) times higher than the shear stiffness of the clamps (Cburls=10/3. Cclamp and Cedge>>Cclamp). A configuration which provides these characteristics in accordance with an embodiment of the present invention is depicted in FIG. 5. In particular, FIG. 5 shows a support 30 to support the patterning object. The support 30 comprises a membrane 46 which is connectable to the support structure MT. The width of the membrane in the X direction is about 10 millimeters. The length of the membrane in the scanning direction is about 150 millimeters. Disposed on the membrane 46 is an interface 48. The interface 48 has a width in the X direction of about 1 millimeter and a height in the Z direction of about 0.2 millimeters. The interface 48 extends across the length of the membrane in the scanning (Y) direction. The interface 48 provides a support for the clamp 44 and for the structures 32, 34, 36 which support the patterning object. By providing an interface 48 between the membrane 46 and the clamp 44 and structures 32, 34, 36, the local shear stiffness of the structures 32, 34, 36 is balanced. The clamp 44 comprises a substantially planar element extending in the X and Y directions and disposed at a substantially central region on the interface 48. The inner and outer edges 32, 36 are disposed on the clamp and extend in the Y direction. They have a length in the Y direction of 150 millimeters, a width in the X direction of 0.5 millimeters and a height in the Z direction of 0.2 millimeters. The plurality of burls 34 are disposed on the clamp 44 in a central region. The central region may align with the central region of the interface 48 on which the clamp 44 is disposed. The clamp 44 has a width in the X direction of 9 millimeters. Thus, the half width of the clamp, i.e. the distance from the center of the burl row to the outer and inner edge, respectively, is 4.5 millimeters. As mentioned, the support may comprise a membrane 46 and an interface 48. The interface 48 may be disposed on the membrane 46 between the membrane 46 and the clamp 44. Further, the structures 32, 34, 36 may be disposed on the clamp 44 and include an outer edge 36, an inner edge 32 and a plurality of burls 34 disposed between the inner and outer edge 32, 36. Further, the clamp 44 may comprise a central region 50 and the interface 48 supports the clamp 44 at the central region 50.

The skilled person will understand that the values for the dimensions of the various element may vary. Further, their arrangement may vary. For example, the edges 32, 36 and burls 34 may not extend along the entire length of the clamp 44. In such an embodiment, where the clamp is a vacuum clamp, an additional sealing element may be provided.

Figure 6:
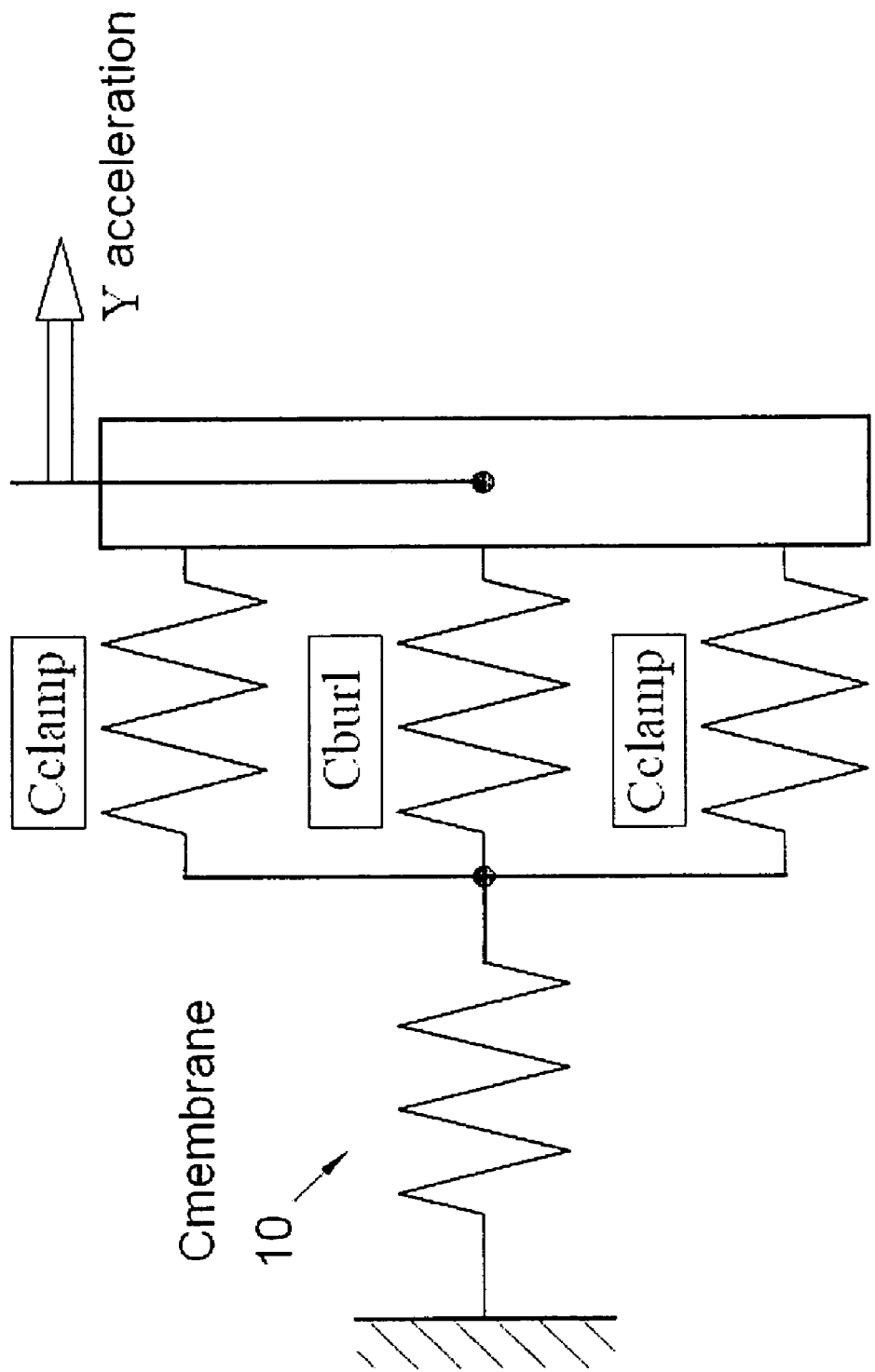
FIG. 6 depicts a spring-mass model in a scan direction (Y) of the clamp according to an embodiment of the invention.

FIG. 6 depicts a spring-mass model in a scan direction (Y) of the clamp according to an embodiment of the invention, for example, as shown in FIG. 5. Thus, in accordance with an embodiment of the invention, Cclamp=G.L.t/B=36e9.150e−3.200e−6/4e−3=27e7 [N/m], Cburls=10/3.Cclamp=10/3.42e7=9e8 [N/m], Shear stiffness of one burl=Cburl=G.A/h=36e9. pi/4.0.5e−3^2/0.2e−3=37.5e6 [N/m], wherein the diameter is equal to 0.5 millimeters and the height (h) is equal to 0.2 millimeters, and Total number of burls=n=Cburls/Cburl=9e8/37.5e6=24.

In FIG. 6, the balanced situation is plotted. As calculated above, the normal force (and thus the friction limit) in the middle (at the burls) is a factor x (in this case 10/3) times higher than at the edges. As a result the clamp is redesigned in a way that the shear stiffness of the middle (burls) are a factor x (in this case 10/3) times higher. This way the friction limit is reached at the same time for each contact (burls and edges) when the mask is preloaded Yacceleration [nm] in Y-direction.

In accordance with an embodiment of the invention, reduction of slip of the patterning object may reduce overlay error. Further, there may be a strong correlation between a hysteresis (patterning object slip in scanning (Y) direction) and focal errors in the Z-direction. Thus, by reducing the patterning object slip, focal errors may also be reduced. This is achieved in a cheap and efficient manner.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning object defines the pattern created on a substrate. The topography of the patterning object may be pressed into a layer of resist supplied to the substrate whereupon the resist is cured by applying electromagnetic radiation, heat, pressure or a combination thereof. The patterning object is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a support constructed to support a patterning object, the patterning object being capable of imparting a radiation beam with a pattern in its cross-section to form a patterned radiation beam;
wherein the support comprises a plurality of structures having a plurality of local contact areas, respectively, on which the patterning object is disposed, in use, and a clamp configured to clamp the patterning object to the plurality of local contact areas, wherein each structure is configured so that a local shear stiffness of each local contact area is substantially balanced in a ratio with a local friction limit at each local contact area, respectively,
wherein for each structure, the ratio of the local shear stiffness and the local friction limit is a constant value.

2. The apparatus of claim 1, wherein each structure is configured so that a slip limit of the plurality of structures is exceeded when a certain same force is applied to each structure.

3. The apparatus of claim 2, further comprising a motor configured to apply a force to the support to cause the support to move in a scanning direction, wherein, in use, the force applied to the support is less than the certain same force, so that each structure experiences a force lower than the slip limit.

4. The apparatus of claim 2, wherein a local shear force at each contact area exceeds a slip limit at the same time.

5. The apparatus of claim 2, wherein, at the slip limit, the patterning object at a location, including the plurality of local contact areas, on the support experiences a displacement with respect to the location.

6. The apparatus of claim 1, wherein the local friction limit is determined by varying a force in a direction normal to the local contact area, a friction coefficient, or both.

7. The apparatus of claim 1, wherein the local shear stiffness is determined by varying a dimension of the structure, a material of the structure, or both.

8. The apparatus of claim 1, wherein the clamp is a vacuum clamp.

9. The apparatus of claim 1, wherein the plurality of structures are disposed on the clamp and include an outer edge, an inner edge and a plurality of burls disposed between the inner and outer edge.

10. The apparatus of claim 1, wherein the support comprises a membrane and an interface, wherein the interface is disposed on the membrane between the membrane and the clamp.

11. The apparatus of claim 10, wherein the clamp comprises a central region and the interface supports the damp at the central region.

12. A lithographic projection apparatus arranged to project a pattern from a patterning object onto a substrate, comprising:
a support constructed to support the patterning object, the patterning object being capable of imparting the radiation beam with a pattern in its cross-section to form a patterned radiation beam;
wherein the support comprises a plurality of structures having a plurality of local contact areas, respectively, on which the patterning object is disposed, in use, and a clamp configured to clamp the patterning object to the plurality of local contact areas, wherein each structure is configured so that the local shear stiffness of each local contact area is substantially balanced in a ratio with the local friction limit at each local contact area, respectively,
wherein for each structure, the ratio of the local shear stiffness and the local friction limit is a constant value.

13. A device manufacturing method, comprising:
supporting a patterning object on a support, the patterning object being capable of imparting the radiation beam with a pattern in its cross-section to form a patterned radiation beam;
clamping a patterning object on a plurality of structures of a support, the plurality of structures having a plurality of local contact areas, respectively, each structure configured so that the local shear stiffness of each local contact area is substantially balanced in a ratio with the local friction limit at the each local contact area, respectively,
wherein for each structure, the ratio of the local shear stiffness and the local friction limit is a constant value; and
projecting the patterned radiation beam onto a substrate.

14. The method of claim 13, wherein each structure is configured so that a slip limit of the plurality of structures is exceeded when a certain same force is applied to each structure.

15. The method of claim 14, further comprising applying a force to the support to cause the support to move in a scanning direction, wherein the force applied to the support is less than the certain same force, so that each structure experiences a force lower than the slip limit.

16. The method of claim 14, wherein a local shear force at each contact area exceeds a slip limit at the same time.

17. The method of claim 14, wherein, at the slip limit, the patterning object at a location, including the plurality of local contact areas, on the support experiences a displacement with respect to the location.

18. The method of claim 13, wherein the plurality of structures are disposed on the clamp and include an outer edge, an inner edge and a plurality of burls disposed between the inner and outer edge.

* * * * *